United States Patent [19]
Taniguchi et al.

[11] Patent Number: 5,334,267
[45] Date of Patent: Aug. 2, 1994

[54] SPUTTERING TARGET FOR MAGNETIC RECORDING MEDIUM AND METHOD OF PRODUCING THE SAME

[75] Inventors: Shigeru Taniguchi, Yasugi; Akira Kawakami; Hideo Murata, both of Matsue, all of Japan

[73] Assignee: Hitachi Metals, Ltd., Tokyo, Japan

[21] Appl. No.: 99,425

[22] Filed: Jul. 30, 1993

[30] Foreign Application Priority Data

Aug. 3, 1992 [JP] Japan .................. 4-226414
Mar. 29, 1993 [JP] Japan .................. 5-093608

[51] Int. Cl.$^5$ .............................. C22C 19/07
[52] U.S. Cl. ..................... 148/425; 420/436; 148/674; 72/700
[58] Field of Search ............. 148/425, 674; 420/436

[56] References Cited

FOREIGN PATENT DOCUMENTS

| 48801 | 1/1988 | European Pat. Off. | 148/325 |
| 58-204146 | 11/1983 | Japan | 420/436 |
| 60-24006 | 2/1985 | Japan | 420/436 |
| 64-25617 | 1/1989 | Japan . | |
| 312816 | 1/1991 | Japan . | |

OTHER PUBLICATIONS

"Digests of the Twelfth Annual Conference on Magnetics", p. 23, Effects of Substituted Elements into the Magnetic Layer on CoNiCr/Cr Sputtered Hard Disk, M. Ishikawa, et al.

Primary Examiner—Deborah Yee
Attorney, Agent, or Firm—Sughrue, Mion, Zinn, Macpeak & Seas

[57] ABSTRACT

A sputtering target preferably having an average crystal-grain diameter of 300 μm or less and a maximum magnetic permeability of 100 or less is formed of an alloy consisting essentially of, by atom, 5–30% Ni, 5–14% Cr, not more than 6% V, and balance of Co and unavoidable impurities. It is preferable for the target to keep a working-strain remaining therein to reduce the maximum magnetic permeability. A method of producing a sputtering target for magnetic recording and reproducing, in which warm working or cold working is applied to the alloy.

4 Claims, 5 Drawing Sheets

MAGNIFICATION OF 50

MAGNIFICATION OF 50

SPUTTERING TARGET FOR MAGNETIC RECORDING MEDIUM AND METHOD OF PRODUCING THE SAME

BACKGROUND OF THE INVENTION

The present invention relates to a sputtering target which is used to form Co-alloy magnetic layers for a magnetic recording medium by means of sputtering, and also relates to a method of producing the same.

A magnetic disk unit has at least one magnetic head, which faces a magnetic recording medium with a close gap, to perform recording and reproducing by conducting magnetic recording on the magnetic recording medium and reading magnetic information recorded on the medium. The magnetic recording medium has a magnetic alloy film, made of Co-Ni-Cr, Co-Cr-Ta, Co-Cr-Pt, or the like, formed on a substrate of the medium directly or via a primary-coated film. Recently, various ideas such as increasing the coercive force of the magnetic film or reducing a noise have been proposed for the magnetic recording medium to cope with high density recording.

In a publication of JP-A-1-25617, for example, a magnetic recording medium having a magnetic alloy film formed by an alloy of four elements such as Co-Cr-Ta-Pt, a composition of the magnetic alloy film for the above-described high density recording, was revealed. When the amount of platinum added is within a range of 1 to 15 atomic %, as revealed in the above publication, the coercive force of the magnetic film becomes greater than approximately 1200 Oe, and a squareness ratio of the same became 0.8 or greater.

On page 23 of the 12th Academic Lecture Review Book (1988) of the Institute of Applied Magnetism of Japan (transliteration), it is stated that a saturation magnetization of a magnetic alloy film has not been reduced much, but coercive force of the same has been improved by further addition of vanadium to the alloy composition 20 atomic % of nickel, 10 atomic % of chromium, and balance of cobalt. It is also stated that the coercive force of the magnetic alloy film has been improved by from 1000 Oe to 1500 Oe by adding 1 atomic % of vanadium to the composition thereof.

From the foregoing, it is understood when vanadium is added to the composition of the magnetic film made of Co-Ni-Cr, the coercive force of the film is improved without reducing much saturation magnetization.

A conventional method of obtaining the magnetic alloy film is introduced in the above-mentioned Review Book of the Institute of Applied Magnetism of Japan, wherein an alloy film was formed by a magnetron-sputtering apparatus by using a so-called composite target in which pellets of nickel, chromium, and vanadium were set on a Co-Ni alloy.

However, when this type of target is used for magnetron-sputtering, a difference in a sputtering speed occurs between pellets. Therefore, there has been a problem such that geometrical irregularity or steps are generated at boundaries between pellets causing the abnormal discharge, which eventually causes a fluctuation of the film thickness and reproducing outputs. In addition, the occurrence of the abnormal discharge has an unfavorable phenomenon in that it may also cause an adhesion of foreign particles (generally called as particles) in the magnetic film to increase the number of errors occurred on a magnetic disk.

Further, when an alloy of Co-Ni or Co-Ni-Cr, which becomes a base of the above-described composite target, is produced by means of conventional processes of vacuum-melting and subsequent hot rolling, crystal grain having an average diameter of only approximately 400 μm can be obtained.

The sputtering speed also depends on the crystal orientation of crystal grain of the target composition. Therefore, when the crystal-grain diameter is large, the steps are produced at the boundary area of crystal grain. These steps also cause abnormal discharge in the same manner as described before; therefore, a target having a smaller crystal-grain diameter has been desired.

In addition, Co-Ni alloy system is a magnetic substance of fcc-structure having a higher maximum magnetic permeability; therefore, it is difficult to obtain a leakage magnetic flux to a target surface, which is indispensable to magnetron-sputtering. Consequently, there is a demand to develop a target which can secure a sufficient leakage flux on the target surface.

SUMMARY OF THE INVENTION

An objective of the present invention resides in providing a sputtering target for a magnetic recording medium and a method of producing the same, wherein the sputtering target can obtain a sufficient leakage flux during magnetron-sputtering; tends to have a smaller incidence for allowing an abnormal discharge; and has a formed magnetic-film having superior magnetic characteristics and recording/reproducing characteristics.

The present inventors has found out that a Co-Ni-Cr-V alloy, containing vanadium as an alloying element, produced by methods of melting or sintering can remarkably micronize or refine crystal grains to be compared with an alloy containing no vanadium. Therefore, the abnormal discharge during sputtering can be remarkably reduced, and the number of errors occurring on a magnetic disk can be reduced.

Accordingly, the present invention provides the sputtering target for the magnetic recording medium, in which the target is made of an alloy consisting essentially of, by atom, of 5 to 30% of nickel, 5 to 14% of chromium, not more than 6% of vanadium, and balance of cobalt and unavoidable impurities.

According to the present invention, the target of an alloy structure having an average diameter of fine crystal grains of preferably not greater than 300 μm can be obtained by containing vanadium as an alloying element, thus reducing the occurrence of steps on the surface of the target during sputtering to a suppress the occurrence of foreign particles in the magnetic film to be formed.

Furthermore, refining of crystal grains reduces a magnetic permeability of the target such that the maximum magnetic permeability becomes not greater than 100, preferably not greater than 50, thus enabling the sputtering target to obtain the leakage flux preferable for magnetron-sputtering.

The target according to the present invention can be obtained by melting Co-Ni-Cr-V alloy followed by casting to produce an ingot, or further applying a hot rolling to the alloy ingot, thereafter conducting an electro-discharge forming thereto to profile a target shape.

In addition, a target can also be obtained by applying a pressurized sintering to a powder mixture consisting of particles of one or more elements selected from cobalt, nickel, chromium and vanadium, which are mixed to form a composition of 5 to 30 atomic % of nickel, 5 to 14 atomic % of chromium, not more than 6 atomic % of vanadium, and balance of cobalt. By this pressurized sintering method, a preferable target can be produced on account of the advanced refining-effect by addition of vanadium. When a target is produced by means of the pressurized sintering, hot rolling can also be applied to the sintered alloy ingot to conduct the electro-discharge forming thereto for profiling a target shape.

The above-mentioned methods of obtaining a target by applying hot rolling to the cast alloy-ingot or the sintered alloy-ingot are advantageous from the view point of obtaining a number of targets from a large-size ingot.

When warm working or cold working can be applied directly, or via hot working, to the cast ingot or the sintered ingot to cause work strain to remain in the target, in other words, to provide internal stress, the maximum magnetic permeability of the target can be as low as not greater than 50 combined with the refining effect of crystal grain caused by vanadium. Thus, a preferable target for magnetron-sputtering can be obtained.

Thus, according to the present invention, provided is an entirety alloy target essentially consisting of four elements. The method of producing such a target is not limited. However, another feature of the present invention is to provide a method of producing a target wherein warm working or cold working is additionally applied in the production process for the purpose of causing work strain to remain in the target to lower the maximum magnetic permeability as much as possible.

DETAILED DESCRIPTION OF THE INVENTION

The reasons why the alloying elements are preferred are now described.

In the present invention, vanadium is a most important element which refines crystal grains of a target and restricts the generation of foreign particles during sputtering along with lowering a maximum magnetic permeability of the target to obtain a leakage flux required for magnetron-sputtering.

In addition, vanadium has the effect of increasing the coercive force and the S/N ratio of a magnetic alloy film being formed. Addition even a small amount of vanadium is effective for refining crystal grain. However, preferably, adding 1.0 or more atomic % of vanadium can greatly reduce an average crystal-grain diameter of the target, and also can remarkably improve the coercive force and S/N ratio of the forming magnetic alloy film.

Even when a content of vanadium exceeds 6 atomic %, it is not effective to further reduce the average crystal-grain diameter of the target. Such an increase in content of vanadium leads to decrease of reproducing output property of the magnetic alloy film. Consequently, the content amount of vanadium is limited to be not more than 6 atomic %.

A content of nickel is specified to be 5 to 30 atomic %, because coercive force of the magnetic alloy film decreases when the nickel amount is less than 5 atomic %, and also the reproducing output decreases when it is more than 30 atomic %.

A content of chromium is specified to be 5 to 14 atomic %, preferably 5 to 9 atomic %, because the coercive force of the magnetic alloy film decreases when the chromium amount is less than 5 atomic %, and also the reproducing output decreases when it is more than 14 atomic %.

EXAMPLE

Experiment 1

An alloy ingot having a composition of $Co_{73-X}Ni_{20}Cr_7V_X$, where X was varied within a range of 0 through 13, was obtained by means of vacuum melting and vacuum casting. The alloy ingot was heated at 1130° C. to be subjected to hot roll for making a plate material. Thus, a target having an outside dimension of 130 mm × 460 mm × 5 mm was obtained by machining.

Figure 1:
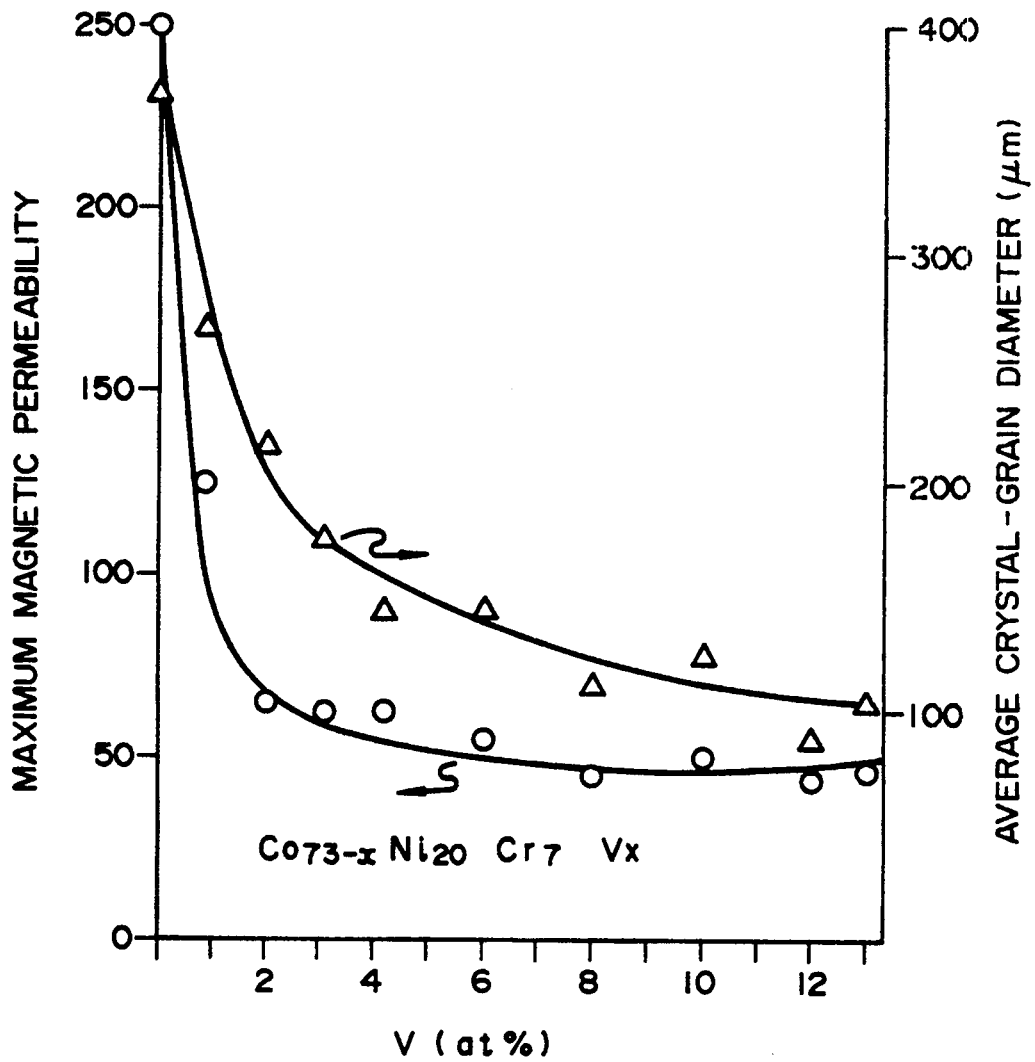
FIG. 1 is a graph representing the relationship of the amount of vanadium vs. magnetic permeability and an average crystal-grain diameter of a sputtering target according to the present invention.
Figure 2:
FIG. 2 is a picture showing the micro structure of sputtering target according to the present invention.
Figure 3:
FIG. 3 is another picture showing the micro structure of comparative sputtering target.

FIG. 1 is a graph representing the relationship of the amount of a vanadium vs. an average crystal-grain diameter and a maximum magnetic permeability of the obtained target. In FIG. 1, a reference symbol "○" denotes maximum magnetic permeability and "Δ" average crystal-grain diameter. FIGS. 2 and 3 are metallographic pictures showing micro structures of the sputtering target containing two atomic % vanadium according to the present invention, and a comparative example having no vanadium, respectively. As shown in FIGS. 1 through 3, remarkable refining of crystal grain was achieved by adding vanadium. Furthermore, it was observed that the smaller the average crystal-grain diameter, the lower the maximum magnetic permeability of the target.

The obtained target was bonded to a copper backing plate by means of indium solder to evaluate properties of the magnetic film made by sputtering.

The surface of a substrate made of aluminum alloy containing 4% by weight of magnesium was polished to be flat by a turning operation, thus producing the substrate having an outer diameter of 95 mm, an inner diameter of 25 mm, and a thickness of 1.27 mm. A plating film having a thickness of 5 to 15 μm made of Ni-P alloy was then formed on the surface of the substrate. Subsequently, the surface of the plating film adhered to the substrate by the aforementioned method was made smooth, and texture working is then applied to the surface for preventing a magnetic head or a slider from sticking thereto. By this texture working, there was secured sliding contact properties (CSS) of a magnetic recording medium against a magnetic head or the slider during the start and the stop operation of the recording medium.

The above-mentioned substrate was then introduced to a DC magnetron-sputtering apparatus in which a chromium primary-coating film having the thickness of 100 nm was formed by the following steps: the atmosphere of a sputtering chamber was exhausted to reduce the ambient pressure down to less than $1 \times 10^{-6}$ tort in which the substrate was heated at 250° C. for 30 minutes; then the pressure of the chamber was raised and maintained at $1 \times 10^{-2}$ tort in which the chromium primary-coating film was made with the forming conditions of a making power of 1,750 W and the film-forming speed of 40 nm/min.

On top of the primary-coated film, a magnetic film having a thickness of 50 nm was formed with the conditions of the making power of 1,820 W and an average speed of film forming of 76 nm/min by the sputtering target which was made of the aforementioned Co-Ni-Cr-V alloy according to the present invention.

At the above-mentioned sputtering of the magnetic film, bias voltage of $-200$ V was provided to the substrate. A protective film having a thickness of 25 nm was formed on top of the above-mentioned magnetic film with the conditions of the making power of 1,200 W and the film-forming speed of 8 nm/min.

A utilization factor of each target was obtained by a lost amount in weight of the target after an electric energy (kilowatt-hour), which was the product of the making power to the target and the used hours, of 96 KW.hr was consumed for the target.

Figure 4:
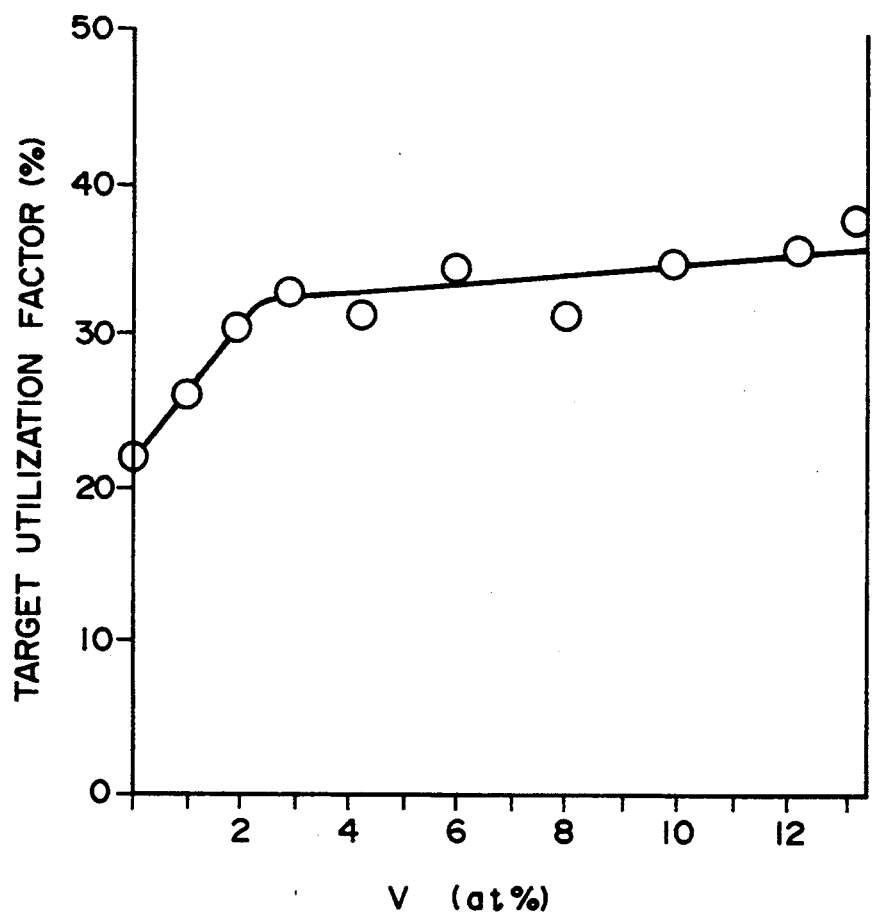
FIG. 4 is a graph representing utilization factor of the sputtering target according to the present invention.

FIG. 4 shows the resultant usage efficiency. As can be apparently understood from FIGS. 4 and 1 that the maximum magnetic permeability was reduced by containing vanadium as an alloy, thus the usage efficiency of the target became higher.

Figure 5:
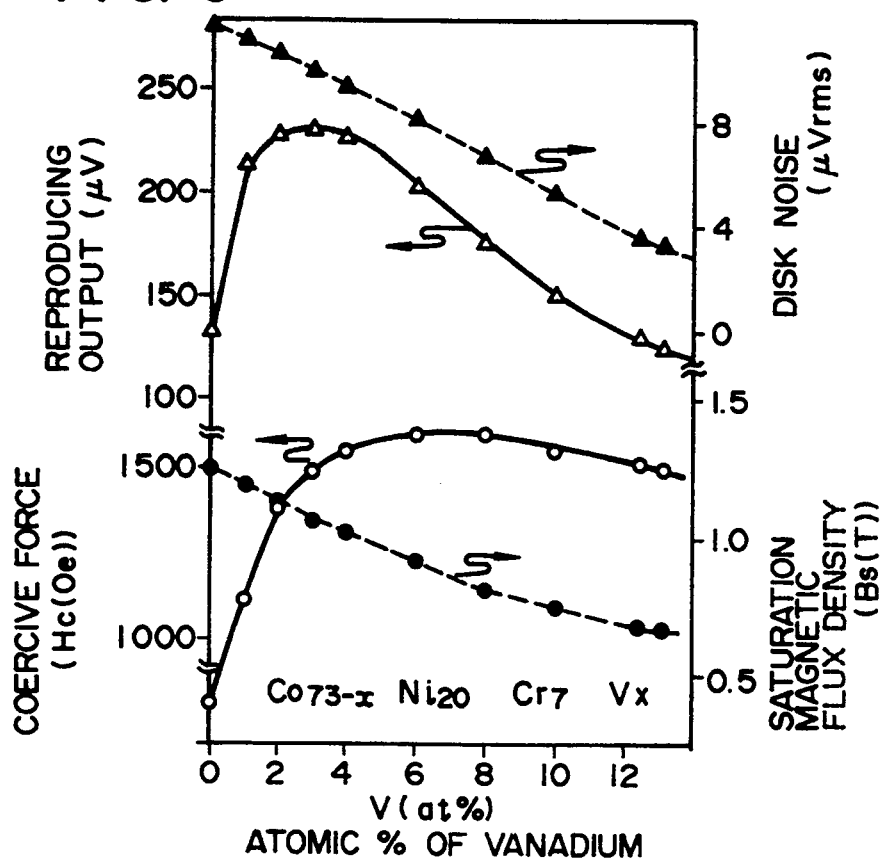
FIG. 5 is a graph representing the relationship of the amount of vanadium vs. coercive force, saturation magnetic flux density, output, and disk noise of a magnetic alloy film target formed by the sputtering target according to the present invention.

In addition, the relationship among coercive force (Hc), saturation magnetic flux density (Bs), a reproducing-head output, and disk noise of the magnetic recording medium obtained by the above-mentioned method is shown in FIG. 5.

As can be understood from FIG. 5, when the adding amount of vanadium increases, the coercive force also increases; however, the saturation magnetic flux density decreases. It can also be understood from the FIG. 5 that the disk noise reduces as the adding amount of vanadium increases. The high output of more than 200 $\mu$V was obtained with the adding amount of vanadium of not more than 6 atomic %; however, when the adding amount was more than 6 atomic %, the output was decreasing.

Experiment 2

An alloy target having a composition of $Co_{65.2}Ni_{24}Cr_9 \cdot V_{1.8}$ (atomic %), an average crystal-grain diameter of 171 $\mu$m, a maximum magnetic permeability of 68, and an outside dimension of 130 mm × 460 mm × 5 mm was produced in the same manner as in the Experiment 1.

In addition, as a comparative example, another alloy target having a composition of $Co_{66}Ni_{25}Cr_9$ (atomic %) a maximum magnetic permeability of 226, and the outside dimension of 130 mm × 460 mm × 5 mm was also produced in the same manner as in the Experiment 1. Then, a vanadium tip of 5 mm × 5 mm × 1 mm having a purity of not less than 99.9% was attached on the surface of this target to make a composite target.

The same sputtering as conducted in the experiment 1 was performed by using the above-mentioned targets to produce a magnetic disk including a magnetic recording medium having an outer diameter of 95 mm.

An examination of the composition variation of vanadium was conducted by analyzing the magnetic disk at 8 separate points located at equal intervals from one another in a concentric circle formed at the halfway point of the radius of the 95 mm-diameter magnetic disk. The result of this analysis is shown in Table 1.

TABLE 1

| | Variation of atomic % of vanadium (Analytical value) | | | |
| --- | --- | --- | --- | --- |
| | Maximum | Minimum | Average | Standard deviation $\sigma x$ |
| Invention alloy target | 1.7 | 1.6 | 1.8 | 0.05 |
| Comparative alloy target | 2.2 | 1.6 | 1.7 | 0.22 |

As shown in Table 1, the film obtained by the alloy sputtering target according to the present invention has less fluctuation in concentration of vanadium, thus forming a uniform film composition.

A recording and reproducing characteristics of the magnetic disk having the obtained magnetic recording medium was then examined, in which the number of errors, or failures, of recorded signal bits was counted. The result showed that the number of errors which occurred on the magnetic recording medium obtained by the alloy target according to the present invention was 4; on the other hand, the number of errors of the comparative composite target was 73.

In addition, the fluctuation ratio (modulation) of the reproducing output along the circumference of a disk of the magnetic recording medium obtained by the alloy target according to the present invention was 7%; on the other hand, the ratio of the same obtained by the comparative composite target was 31%. Consequently, the finding showed that more stable output was obtained by the alloy target according to the present invention.

Experiment 3

Figure 6:
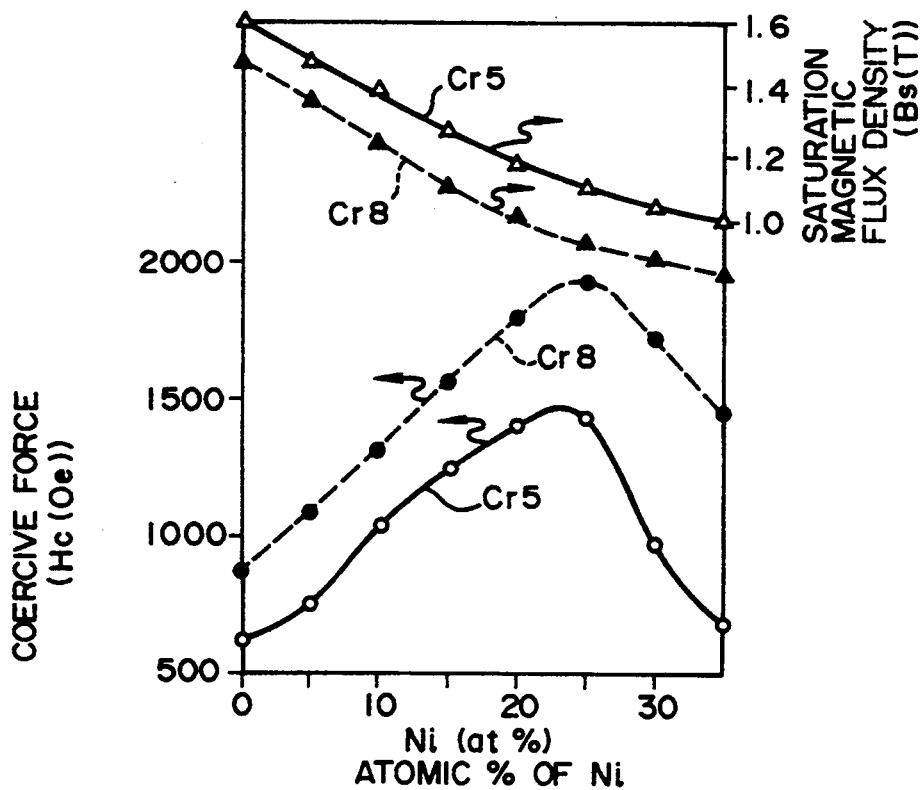
FIG. 6 is a graph representing the relationship of the amount of nickel vs. coercive force and saturation magnetic flux density of a magnetic alloy film target formed by the sputtering target according to the present invention.

Two alloy targets having a composition of $Co_{92-X}Ni_XCr_5V_3$ containing 5 atomic % of chromium and $Co_{89-X}Ni_XCr_8V_3$ containing 8 atomic % of chromium respectively, in which each of the value X was varied within a range of 0 through 35, were produced in the same manner as in the Experiment 1. Subsequently, magnetic recording mediums were produced by using these targets in the same manner as in the Experiment 1, and the coercive force (Hc) and saturation magnetic flux density (Bs) of each magnetic film of the magnetic recording mediums were measured. The result of this measurement is shown in FIG. 6, in which the coercive force of the magnetic film containing 5 atomic % of chromium became 800 Oe or more when the atomic % of nickel ranging from 5 to 30. On the other hand, the coercive force of the other film containing 8 atomic % of chromium became 1200 Oe or more, in which the maximum coercive force was obtained when the containing amount of nickel was 25 atomic % and relatively greater coercive force was obtained within a range of 20 to 30 atomic % of nickel. Saturation magnetic flux density (Bs) of the alloy target was 0.95 (T) when the containing amount of nickel was 30 atomic %. The less the containing amount of nickel, the higher the saturation magnetic flux density. Namely, the alloy target containing the less amount of chromium, e.g. 5 atomic % had the higher saturation magnetic flux density. Accordingly, it is preferable for the coercive force and saturation magnetic flux density of the magnetic film when the containing amount of nickel was within the range of 5 to 30 atomic %.

Experiment 4

Figure 7:
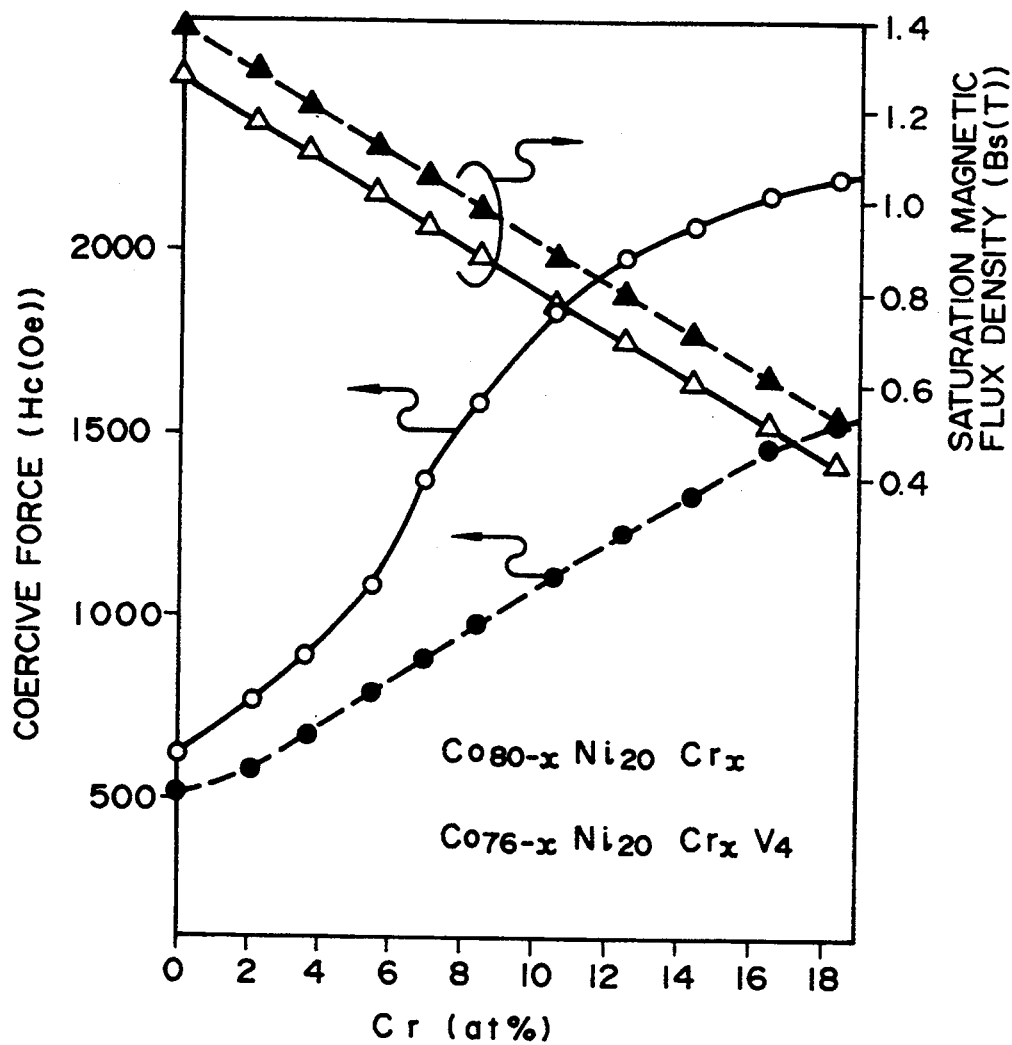
FIG. 7 is a graph representing the relationship of the amount of chromium vs. coercive force and saturation magnetic flux density of a magnetic alloy film target formed by the sputtering target according to the present invention.

Alloy targets of $Co_{76-x}Ni_{20}Cr_xV_4$, and comparative example targets of $Co_{80-x}Ni_{20}Cr_x$, where the value X was varied within a range of 0 through 18, were produced in the same manner as in the experiment 1. Subsequently, magnetic recording mediums were produced by using these targets in the same manner as in the Experiment 1, and the coercive force (Hc) and saturation magnetic flux density (Bs) of each magnetic film of the magnetic recording mediums were measured. The result of this measurement is shown in FIG. 7, in which the greater the containing amount of chromium, the greater coercive force. Especially when the alloy target contains vanadium, a remarkable increase in the coercive force can be obtained when the containing amount of the atomic % of chromium was 5 or more.

On the other hand, when the atomic % of chromium exceeds 14, almost no increase in the coercive force occurs. Furthermore, the saturation magnetic flux density declines along with the increase in the containing amount of chromium; therefore, it is not preferable to contain greater amount of chromium. Accordingly, the preferable containing amount of chromium ranges within the range from 5 to 14 atomic %.

Experiment 5

An alloy ingot having a composition of 20 atomic % of nickel, 7 atomic % of chromium, 2 atomic % of vanadium, and balance of cobalt was subjected to vacuum melting and vacuum casting, and then heated to 1130° C. to conduct hot rolling. The finishing temperature of the hot rolling was 900° C. The maximum magnetic permeability measured at this time was 68, and the average crystal-grain diameter was 216 μm.

After the hot rolling being conducted, 13% cold rolling was conducted to the hot-rolled plate, and machine working was applied thereto to obtain a target having the same shape as the one obtained in the experiment 1. The maximum magnetic permeability measured at this time was 8.

In addition, another alloy ingot having the same composition as the one described above in this Experiment was subjected to vacuum melting and vacuum casting, and then heated at 1130° C. to conduct the hot rolling. The finishing temperature of the hot rolling was 500° C., which means that substantially warm rolling was applied finally.

Machining was conducted to the obtained roll plate material for making a target having the same shape as the one obtained in the experiment 1. The maximum magnetic permeability of this target was 10 and the average crystal-grain diameter was 184 μm.

The above-mentioned two different targets in this experiment could keep a work strain remaining in these targets by means of cold working or warm working; thus, the lower ratio of the maximum magnetic permeability could be achieved.

Experiment 6

Atomized powder having a composition of 20 atomic percent of nickel, 7 atomic percent of chromium, 2 atomic percent of vanadium, and balance of cobalt was made to obtain under 120 mesh of alloy powder. The alloy powder was then filled in a metallic container made of mild steel (JIS S15C) to seal under the reduced pressure. Then, the sealed alloy powder was sintered by a hot isostatic press at 1200° C. and 1000 atmospheric pressure. The sintered ingot was heated to 1130° C. to conduct the hot roll. Then, a machine working was applied to the hot rolled plate to obtain a target having the same shape as the one obtained in Experiment 1.

The maximum magnetic permeability of this target was 38, and the average crystal-grain diameter was 113 μm. The permeability and the average crystal-grain diameter of the obtained target were respectively lower and smaller than those of the casted and hot-rolled target introduced in Experiment 4. Accordingly, in magnetron-sputtering the target which was formed by sintering and then hot-rolling the alloy ingot was more preferable than the target which was formed by casting and hot-rolling the alloy target.

In addition, another sintered ingot made in the same manner as the one obtained in this experiment was heated to 1130° C. to conduct the hot roll, then 13% cold rolling was applied thereto at room temperature. Then, machine working was conducted to the obtained rolled plate to obtain a target having the same shape as the one obtained in Experiment 1. The maximum magnetic permeability of this target was 7 and its average crystal-grain diameter was 108 μm. Subsequently, it was found that a working-strain could remain even in the target which was obtained from a sintered alloy; therefore, the maximum magnetic permeability of a target could be reduced.

According to the present invention, by the refining effect of crystal grain of vanadium, the maximum magnetic permeability can be lowered and also a sufficient leakage flux can be obtained during magnetron-sputtering. Furthermore, a single target having a uniform composition can be produced by the producing method according to the present invention by employing the Co-Cr-Ni-V alloy of the present invention. Therefore, there is provided a magnetic recording medium, having a smaller incidence of abnormal discharge in combination with the crystal-grain refining effect, and also having a superior magnetic characteristics and recording and reproducing characteristics as a magnetic film to be formed.

Furthermore, when the work strain remains in the target, the maximum magnetic permeability of the target can be not greater than 50 in combination with the crystal-grain refining effect to produce a target extremely preferable for magnetron-sputtering.

What is claimed is:

1. A sputtering target for a magnetic recording medium, wherein said target is formed of a quaternary alloy consisting essentially of, by atom, 5 to 30% of nickel, 5 to 14% of chromium, not more than 6% of vanadium, and balance of cobalt and unavoidable impurities, and wherein said target has an average crystal-grain diameter of not greater than 300 μm.

2. A sputtering target according to claim 1, wherein work strain remains in said target.

3. A sputtering target according to claim 1, wherein maximum magnetic permeability of said target is not greater than 100.

4. A method of producing a sputtering target for a magnetic recording medium, said method comprising:
applying warm working or cold working to a quaternary alloy consisting essentially of, by atom, 5 to 30% of nickel, 5 to 14% of chromium, not more than 6% of vanadium, and balance of cobalt and unavoidable impurities, thereby causing work strain to remain in said target so as to lower the maximum magnetic permeability thereof.

* * * * *